(12) United States Patent
Akdas et al.

(10) Patent No.: US 11,905,446 B2
(45) Date of Patent: Feb. 20, 2024

(54) DOPED SEMICONDUCTOR NANOCRYSTALS, METHOD FOR PREPARING SAME AND USES THEREOF

(71) Applicant: COMMISSARIAT À L'ENERGIE ATOMIQUE ET AUX ÉNERGIES ALTERNATIVES, Paris (FR)

(72) Inventors: Tugce Akdas, Grenoble (FR); Peter Reiss, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 220 days.

(21) Appl. No.: 17/418,347

(22) PCT Filed: Dec. 23, 2019

(86) PCT No.: PCT/FR2019/053287
§ 371 (c)(1),
(2) Date: Jun. 25, 2021

(87) PCT Pub. No.: WO2020/136347
PCT Pub. Date: Jul. 2, 2020

(65) Prior Publication Data
US 2022/0064525 A1 Mar. 3, 2022

(30) Foreign Application Priority Data
Dec. 26, 2018 (FR) ........................ 1874171

(51) Int. Cl.
*C09K 11/70* (2006.01)
*C09K 11/74* (2006.01)
(Continued)

(52) U.S. Cl.
CPC ............... *C09K 11/70* (2013.01); *C30B 7/14* (2013.01); *C30B 29/40* (2013.01); *H01L 31/055* (2013.01); *H01L 33/502* (2013.01)

(58) Field of Classification Search
CPC .... C09K 11/70; C09K 11/7492; C09K 11/757
See application file for complete search history.

(56) References Cited

U.S. PATENT DOCUMENTS 5,985,173 A * 11/1999 Gray ................... C09K 11/574
  252/301.5
6,379,583 B1 * 4/2002 Gray ................... C09K 11/08
  252/301.4 R
(Continued)

FOREIGN PATENT DOCUMENTS

FR  2930786 A1  11/2009
WO  2010052221 A1  5/2010

OTHER PUBLICATIONS

Thuy, Ung Thi Dieu et al., 2013, "Europium doped In(Zn)P/ZnS colloidal quantum dots", IN: Dalton Trans., vol. 42, Jan. 1, 2013, p. 12606-12610.
(Continued)

*Primary Examiner* — Matthew E. Hoban
(74) *Attorney, Agent, or Firm* — Pearne & Gordon LLP

(57) ABSTRACT

A set of nanocrystals comprising a semiconductor comprising A representing a metal or metalloid in the +III oxidation state and B representing an element in the –III oxidation state, the nanocrystals being doped, on average per nanocrystal, by an atom of C chosen from the transition metals in the +I or +II oxidation state and various uses thereof.

23 Claims, 3 Drawing Sheets

(51) Int. Cl.
  *C30B 7/14* (2006.01)
  *C30B 29/40* (2006.01)
  *H01L 31/055* (2014.01)
  *H01L 33/50* (2010.01)

(56) References Cited

U.S. PATENT DOCUMENTS

| | | | |
|---|---|---|---|
| 7,175,778 B1* | 2/2007 | Bhargava | H01F 1/0036 252/62.51 R |
| 9,260,652 B2 | 2/2016 | Peng et al. | |
| 9,543,385 B2 | 1/2017 | Cohen et al. | |
| 2007/0194279 A1 | 8/2007 | Peng et al. | |
| 2011/0097879 A1 | 4/2011 | Reiss et al. | |
| 2012/0061627 A1 | 3/2012 | Reiss et al. | |
| 2012/0261624 A1 | 10/2012 | Peng et al. | |
| 2013/0299772 A1 | 11/2013 | Cohen et al. | |
| 2018/0216003 A1* | 8/2018 | Zhang | C09K 11/642 |

OTHER PUBLICATIONS

Sahu, Ayaskanta et al., 2012, "Electronic impurity doping in CdSe nanocrystals" IN: , Nano Lett., vol. 12, May 9, 2012, pp. 2587-2594.

Prochazkova, Olga et al., "InP based semiconductor structures for radiation detection" IN: Journal of Material Science: Materials in Electronics; Kluwer Academic Publishers, BO, vol. 19, No. 8-9, Sep. 25, 2007, pp. 770-775.

Somaskandan K et al., "Isolavent doping strategy for manganese introduction into III-V diluted magnetic semiconductor nanoparticles: InP:Mn" IN: Chemistry of Materials, American Chemical Society, Washington DC, US, vol. 17, No. 5, Mar. 8, 2005, pp. 1192-1198.

Xie, Renguo et al, "Synthesis of Cu-doped InP nanocrystals (d-dots) with ZnSe diffusion barrier as efficient and color-tunable NIR emitters" IN: Journal of the American Chemical Society, vol. 131, No. 30, Aug. 5, 2009, pp. 10645-10651.

Zhang, Zhuolei et al., "Dual emissive Cu:InP/Zns/InP/ZnS nanocrystals: single-source "Greener" emitters with flexibility tunable emission from visible to near-infrared and their application in white light-emitting diodes" IN: Chemistry of Materials, vol. 27, No. 4, Feb. 12, 2015, pp. 1405-1411.

International Search Report for PCT/FR2019/053287 dated Apr. 15, 2020.

Written Opinion for PCT/FR2019/053287 dated Apr. 15, 2020.

Preliminary French Search Report for French application No. FR1874171 dated Oct. 1, 2019.

* cited by examiner

DOPED SEMICONDUCTOR NANOCRYSTALS, METHOD FOR PREPARING SAME AND USES THEREOF

CROSS-REFERENCE TO RELATED APPLICATIONS

This is a National Stage application of PCT international application PCT/FR2019/053287, filed on Dec. 23, 2019, which claims the priority of French Patent Application No. 1874171, filed Dec. 26, 2018, both of which are incorporated herein by reference in their entirety.

TECHNICAL FIELD

The present invention relates to the technical field of luminescent semiconductor nanocrystals and in particular doped semiconductor nanocrystals.

More particularly, the present invention proposes nanocrystals based on a type III-V semiconductor weakly doped with a transition metal in the +I or +II oxidation state, said nanocrystals being optionally coated with a shell of a semiconductor, identical to or different from the semiconductor of said nanocrystals.

The present invention also relates to a method for preparing such nanocrystals and their various uses. Indeed, the field of application of these nanocrystals includes, for example, light-emitting diodes, photovoltaic cells, the fluorescent marking of chemical molecules, in particular for anti-counterfeiting purposes and the fluorescent labelling of biological molecules, in particular, for biological imaging and detection.

PRIOR ART

In a general way, nanoparticles are of great interest as they have many possible applications, such as image display devices, information storage, biomarkers, diagnostic imaging, drug delivery, theranostics, photovoltaics, sensors and catalysts.

The optical properties required for this purpose are notably a narrow emission profile (pure colour emission), in particular, in the red or near infrared range (NIR), a high photoluminescence quantum yield (PLQY), and an absence of overlap between the absorption and emission spectra (Stokes shift).

Furthermore, depending on the intended application, these optical properties may have additional features. Thus for biological applications in vivo, there needs to be a window of optical transparency between 650 nm and 950 nm and, for luminescent solar concentrators, the Stoke shift needs to be large.

Among the nanoparticles that can be used are semiconductor nanocrystals, luminescent materials that have been known for several decades and the size of which is approximately in the range of 1 to 10 nm. These semiconductor nanocrystals are also known as "quantum dots". The entire palette of visible and near infrared and ultraviolet colours can be obtained with semiconductor nanocrystals by choosing their size and composition appropriately.

In general, the optical quality of a luminescent material composed of semiconductor nanocrystals depends on a plurality of parameters, the most important of which are:
i) the size of semiconductor nanocrystals, which regulates the emission wavelength;
ii) the size distribution of the semiconductor nanocrystals, which controls the emission line width;
iii) the surface passivation of the semiconductor nanocrystals, which is responsible for the fluorescence quantum yield and the stability over time. This passivation is obtained by growing, around the semiconductor nanocrystal that forms a "core", a shell of a semiconductor with a greater band-gap. This system is referred to as "core/shell" in the scientific literature.

The semiconductor nanocrystals can be binary, such as cadmium and lead chalcogenides. The latter have some of the desired optical properties, namely a narrow emission profile in the red or near infrared range and a high photoluminescence quantum yield. However, the Stokes shift is not large enough to avoid losses caused by reabsorption. Furthermore, the European RoHS (Restriction of Hazardous Substances) Directive aims to eliminate the following substances from electrical and electronic equipment (EEE), marketed in Europe from 1 Jul. 2006: lead, mercury, cadmium, hexavalent chromium, polybrominated biphenyls (PBB), polybrominated diphenyl ethers (PBDE), thus preventing their use in the preparation of semiconductor nanocrystals.

There are also nanocrystals of multinary I-III-VI type semiconductors, such as for example nanocrystals of $CuInS_2$. The latter are difficult to use in the envisaged applications because of very broad emission in the red range and poorly defined absorption.

Doped semiconductor nanocrystals have also been described in the prior art.

Thus, U.S. Pat. No. 9,260,652 [1] proposes, in a general manner, semiconductor nanocrystals of type II-VI or III-V, doped with a dopant which can be a transition metal and optionally coated with a semiconductor shell. The dopant is present, in the nanocrystals considered in [1] in an amount between 1% and 50% by atomic mass. In the experimental part of [1], 2 to 20% copper atoms by atomic mass are introduced into indium phosphide (InP) nanocrystals, which are coated or nor with zinc selenide (ZnSe). This introduction leads to a broadening of the emission profile in the red range, which is contrary to the desired optical properties.

Thuy et al, 2013 [2] describe the chemical synthesis of In(Zn)P alloy nanocrystals doped with europium ions ($Eu^{3+}$) in large quantities (several % by atomic mass) then coated with a zinc sulphide (ZnS) shell. These nanocrystals have a weak dopant emission signal, only visible with a lag between the excitation and the detection of the photoluminescence.

Furthermore, U.S. Pat. No. 9,543,385 [3] describes the doping of semiconductor nanocrystals of type I-VII, II-VI, III-V, IV-VI, III-VI or IV by at least two atoms of dopant/nanocrystal. The doping of indium arsenide (InAs) nanocrystals with silver (Ag) is exemplified in [3]. From the experimental results obtained, it appears that the initial emission signal of undoped InAs nanocrystals broadens and strongly decreases with the addition of silver. In addition, neither undoped InAs nanocrystals nor doped nanocrystals exhibit a large Stokes shift.

Lastly, Sahu et al, 2012 [4] proposes an example in which the low doping regime approaching a dopant (Ag) per type II-VI nanocrystal (cadmium selenide (CdSe)) has been explored. In these conditions, the use of a low number of dopants per nanocrystal (generally 2 or 3 dopants per nanocrystal) results in a significant improvement of the phospholuminescence efficiency in a band edge emission, while neither a red shift nor an increase of the Stokes shift (generally between 15 and 25 nm) are observed.

In view of the increasing interest in semiconductor nanocrystals, the inventors have set themselves the goal of proposing semiconductor nanocrystals that exhibit all of the desired optical properties, namely a narrow emission profile, in particular, in the red or near infrared range, a high photoluminescence quantum yield and a large Stokes shift.

PRESENTATION OF THE INVENTION

The present invention makes it possible to achieve the aim defined by the inventors and thus relates to semiconductor nanocrystals which have all or some of the optical properties that are sought and listed above.

Indeed, the inventors have shown in a surprising manner that weakly doping nanocrystals comprising a type III-V semiconductor, i.e. with on average one atom of a transition metal in the +I or +II oxidation state per nanocrystal, it is possible to obtain nanocrystals having interesting optical properties since these nanocrystals have a narrow emission profile, in particular a narrower profile than the same nanocrystals that are doped on average by more than one atom of the same transition metal, as well as a Stokes shift greater than 50 nm, in particular greater than 75 nm and, in particular, greater than 100 nm.

For example, when the weakly doped nanocrystals according to the invention are silver-doped InP nanocrystals and coated with a ZnS shell, the latter have an adsorption of about 530 nm, an emission in the red/near infrared range of about 700 nm, a line width at mid-height of between 70-80 nm and a fluorescence quantum yield greater than 20%. It should be noted that the presence of the shell contributes to the efficacy of photoluminescence without influencing the position of the emission peak or the line width.

These results are surprising and unexpected, in particular with reference to the results presented in [4] and obtained for type II-VI nanocrystals weakly doped with a transition metal in the +I oxidation state. In this prior art, the weak doping did not lead to a shift of the emission peak or to an increase of the Stokes shift (generally between 15 and 25 nm). In contrast, in the present invention, the emission at the band edge is completely extinguished and a new emission peak, shifted far in the red with a Stokes shift of at least 150 nm appears, which suggests that the emission mechanism in the two systems is completely different.

The present invention relates to a set of nanocrystals comprising a semiconductor comprising A representing a metal or metalloid in the +III oxidation state and B representing an element in the −III oxidation state, said nanocrystals being doped, on average per nanocrystal, with a C atom selected from the transition metals in the +I or +II oxidation state.

Advantageously, the nanocrystals according to the invention are in colloidal form.

The nanocrystals according to the invention comprise a semiconductor comprising A representing a metal or metalloid in the +III oxidation state and B representing an element in the −III oxidation state, this type of semiconductor being referred to as III-V.

A, the metal or metalloid in the +III oxidation state, forming with B the semiconductor comprised in the nanocrystals according to the invention is selected from gallium (Ga), indium (In), aluminium (Al) and mixtures thereof.

B, an element in the −III oxidation state, forming with A the semiconductor comprised in the nanocrystals according to the invention, is selected from antimony (Sb), arsenic (As), phosphorus (P), nitrogen (N) and mixtures thereof.

Examples of semiconductors of formula AB included in the nanocrystals according to the invention are GaAs, GaSb, GaN, GaP, InAs, InSb, InN, InP, AlAs, AlSb, AlN, AlP, GaNP, GaNAs, GaPAs, AlNP, AlNAs, AlPAs, InGaAs, InGaSb, InGaN, InGaP, InAlAs, InAlSb, InAlN, InAlP, InNP, InNAs, InPAs, GaAlAs, GaAlSb, GaAlN, GaAlP, GaAlNP, GaAlNAs, GaAlPAs, GaInNP, GaInNAs, GaInPAs, InAlNP, InAlNAs, InAlPAs and mixtures thereof. In particular, the nanocrystals according to the invention comprise a semiconductor of formula AB selected from InP, InAs, InGaP and mixtures thereof and, more particularly, said semiconductor is InP.

Advantageously, the nanocrystals according to the invention consist exclusively of a semiconductor of formula AB as defined above and of one C atom per nanocrystal. In a particular embodiment, the doped nanocrystals used in the invention consist exclusively of C:InP.

Alternatively, the nanocrystals according to the invention comprise at least one other element in addition to a semiconductor of formula AB as defined above and one C atom per nanocrystal. In this alternative, one can refer to an alloy comprising a semiconductor AB as defined above and an additional element D. This alloy is of formula A(D)B with A and B as defined above and D representing the additional element in the form of a metal or metalloid in the +II or +III oxidation state.

Examples of additional elements of formula D included in the nanocrystals according to the invention are in particular barium (Ba), zinc (Zn), calcium (Ca), magnesium (Mg), manganese (Mn), copper (Cu), iron (Fe(II)), lead (Pb(II)), mercury (Hg(II)), cobalt (Co), nickel (Ni), gallium (Ga(III)), aluminium (Al(III)) and mixtures thereof. In particular, the nanocrystals according to the invention comprise an alloy of formula A(D)B selected from In(Zn)P, In(Ga)P and mixtures thereof and, more particularly, said alloy is In(Zn)P.

Advantageously, the nanocrystals according to the invention consist exclusively of an alloy of formula A(D)B as defined above and one C atom per nanocrystal. In a particular embodiment, the nanocrystals according to the invention consist exclusively of C:In(Zn)P.

The present invention is characterised by very weak doping of the nanocrystals comprising a semiconductor comprising A representing a metal or metalloid in the +III oxidation state and B representing an element in the −III oxidation state. Indeed, the set of nanocrystals that are the subject-matter of the invention have, on average per nanocrystal, one atom of dopant C selected from the transition metals in the +I or +II oxidation state. It should be noted that the dopant C may be in the crystal lattice forming the nanocrystal according to the invention or on the surface of the latter.

It is easy to verify the weak doping of the nanocrystals, the subject-matter of the invention, by techniques known to the person skilled in the art, such as mass spectrometry and/or optical emission spectrometry with high-frequency-induced plasma. Furthermore, the weakly doped nanocrystals, the subject-matter of the invention, have specific optical and physicochemical properties. Indeed, as presented in the experimental section below, the weakly doped nanocrystals, the subject-matter of the invention, have an X-ray diffractogram identical to that of the same undoped nanocrystals, whereas for nanocrystals doped, on average per nanocrystal, by more than one C atom as defined above, the diffraction peaks shift. With regard to the optical properties of weakly doped nanocrystals, the subject-matter of the invention, the latter have an emission peak shifted towards the red relative to the emission peak of the same undoped nanocrystals, a Stokes shift of at least 50 nm, in particular of at least 75 nm and, in particular, of at least 100 nm and a line width at half height of less than 100 nm, in particular of less than 90 nm and, in particular, of less than 80 nm, whereas, for nanocrystals doped, on average per nanocrystal, by more than one C atom as defined above, a broad emission with a line width generally greater than 100-150 nm is obtained.

Typically, C, the transition metal in the +I or +II oxidation state, doping the nanocrystals according to the invention is selected from copper (Cu), silver (Ag), mercury (Hg), gold (Au) and mixtures thereof. Advantageously, C, the transition metal in the +I or +II oxidation state doping the nanocrystals according to the invention, is selected from copper (Cu(I) or Cu(II)), silver (Ag(I)), gold (Au(I)) and mixtures thereof.

In particular, the nanocrystals according to the invention correspond to one of the following formulae: Ag:InP, Au:InP, Cu:InP, Ag:In(Zn)P, Au:In(Zn)P and Cu:In(Zn)P.

In order to further improve the emission efficacy of the nanocrystals according to the invention, the latter may have a shell arranged on or covering all or part of their surface, the nanocrystals forming the core of this core/shell structure. The outer part of this shell comprises or consists of an oxide such as $SiO_2$ or $Al_2O_3$ or a semiconductor material. The latter has a composition, identical to or different from the composition of the undoped nanocrystal used in the invention.

The shell of the nanocrystals according to the invention may consist of a single layer or a plurality of layers (i.e. be a multilayered shell). In the case where the shell consists of only one layer, the outer part of the shell corresponds to said layer.

In the case where the shell consists of a plurality of layers, the outer part of the shell corresponds to the outer layer of the shell. Within the meaning of the present invention "outer layer" refers to the layer of the shell furthest from the core of the nanocrystal and in direct contact with the medium or environment in which the nanocrystal is located. A multilayered shell can comprise from 2 to 10, in particular from 2 to 5 layers of different semiconductors.

Furthermore, the layer or layers of the shell of the nanocrystals according to the invention can have a uniform chemical composition or, within the same layer, a chemical composition which differs and in particular a chemical composition in the form of a gradient. In this case, the outer part of the shell will consist of the outer zone of a single-layer shell and the outer zone of the outer layer of a multilayered shell.

The outer layer of the shell and, if the shell is multilayered, the layer or layers between the core of the nanocrystal and the outer layer can comprise or consist of an oxide such as $SiO_2$ or $Al_2O_3$ or a semiconductor material having a composition which is identical to or different from the composition of the undoped nanocrystal used in the invention. This semiconductor material can comprise a group IV element, a group II-VI compound, a group II-V compound, a group III-VI compound, a group III-V compound, a group IV-VI compound, a group I-III-VI compound, a II-IV-VI group compound, a group II-IV-V compound, an alloy comprising any of the preceding elements or compounds, and/or a mixture comprising any of the preceding elements or compounds, said alloy or mixture able to be a ternary or quaternary alloy or a mixture.

As illustrative and non-limiting examples, the outer layer of the shell and, when the shell is multilayered, the layer or layers between the core of the nanocrystal and the outer layer can comprise or consist of an oxide or a semiconductor material selected from the group consisting of $SiO_2$, $Al_2O_3$, ZnO, ZnS, ZnSe, ZnTe, CaO, CaS, CaSe, CaTe, SrO, SrS, SrSe, SrTe, BaO, BaS, BaSe, BaTe, CdO, CdS, CdSe, CdTe, MgS, MgSe, MgTe, GaAs, GaN, GaP, GaSe, GaSb, HgO, HgS, HgSe, HgTe, InAs, InN, InP, InGaP, InSb, AlAs, AlN, AlP, AlSb, SnS, SnSe, SnTe, TiN, TiP, TiAs, TiSb, $TiO_2$, PbO, PbS, PbSe, PbTe, Ge, Si, an alloy comprising any of these, and/or a mixture comprising any of these.

In a particular embodiment, the nanocrystals according to the present invention have a shell, the outer part of which comprises a semiconductor of formula $ZnS_{1-x}E_x$, with E representing an element in the −II oxidation state and x being a decimal number such that 0≤x<1. E is an element in the −II oxidation state, in particular selected from oxygen (O), selenium (Se), tellurium (Te) and mixtures thereof.

More particularly, the nanocrystals according to the invention have a core comprising or consisting of a semiconductor material corresponding to one of the following formulae: Ag:InP, Au:InP, Cu:InP, Ag:In(Zn)P, Au:In(Zn)P and Cu:In(Zn)P and a shell comprising or consisting of a semiconductor material of formula $ZnS_{1-x}E_x$, with E and x as previously defined.

Even more particularly, the nanocrystals according to the invention have a core comprising or consisting of a semiconductor material corresponding to one of the following formulae: Ag:InP, Au:InP, Cu:InP, Ag:In(Zn)P, Au:In(Zn)P and Cu:In(Zn)P and a shell comprising or consisting of a semiconductor material of formula ZnS, ZnO, ZnSe or ZnTe and mixtures thereof.

The weakly doped nanocrystals according to the present invention and not coated with a shell, i.e. the core of the weakly doped nanocrystals according to the present invention, have an average diameter between 1 and 10 nm, notably between 1.5 and 8 nm and in particular between 2 and 6 nm.

When present, the shell of the weakly doped nanocrystals according to the present invention has an average thickness between 0.3 and 6 nm, notably between 0.5 and 4 nm and in particular between 1 and 2 nm. Thus, the weakly doped nanocrystals according to the present invention and of the core/shell type have an average diameter of less than 15 nm, notably less than 12 nm and in particular less than 10 nm.

The present invention also relates to a method for preparing a set of weakly doped nanocrystals as defined above, optionally coated, partly or totally, by a shell as previously defined.

Advantageously, the method for preparing a set of weakly doped nanocrystals as defined above, the subject-matter of the present invention, comprises steps of:

a) preparing nanocrystals comprising a semiconductor comprising A representing a metal or metalloid in the +III oxidation state and B representing an element in the −III oxidation state and optionally D representing a metal or metalloid in the +II or +III oxidation state;

b) contacting the nanocrystals prepared in step (a) with a precursor of C, C being selected from the transition metals in the +I or +II oxidation state, at a temperature $T_b$ and for a period $D_b$ making it possible to obtain nanocrystals comprising a semiconductor comprising A representing a metal or metalloid in the +III oxidation state and B representing an element in the −III oxidation state and optionally D representing a metal or metalloid in the +II oxidation state doped, on average per nanocrystal, with a C atom selected from the transition metals in the +I or +II oxidation state;

c) optionally coating all or part of the surface of nanocrystals comprising a semiconductor comprising A representing a metal or metalloid in the +III oxidation state and B representing an element in the −III oxidation state doped, on average per nanocrystal, with a C atom selected from the transition metals in the +I or +II oxidation state, obtained in step (b), with a shell the outer part of which comprises or consists of an oxide or a semiconductor material.

In step (a) of the method according to the invention, any technique known to a person skilled in the art can be used for preparing nanocrystals comprising a semiconductor comprising A representing a metal or metalloid in the +III oxidation state and B representing an element in the –III oxidation state and optionally D representing a metal or metalloid in the +II or +III oxidation state.

Advantageously, step (a) of the method according to the invention comprises the substeps of:
- $a_1$) preparing a solution comprising at least one precursor of A and optionally at least one precursor of D at a temperature $T_{a1}$;
- $a_2$) raising the mixture obtained in substep ($a_1$) from temperature $T_{a1}$ to temperature $T_{a2}$ greater than temperature $T_{a1}$;
- $a_3$) introducing, into the mixture obtained in substep ($a_2$) and maintained at temperature $T_{a2}$, at least one precursor of B; and
- $a_4$) optionally purifying the nanocrystals comprising a semiconductor comprising A representing a metal or metalloid in the +III oxidation state and B representing an element in the –III oxidation state and optionally D representing a metal or metalloid in the +II or +III oxidation state.

Within the meaning of the present invention, the precursor of A used in substep ($a_1$) of the method is selected from the group consisting of a precursor of indium, a precursor of gallium, a precursor of aluminium and mixtures thereof. All of the precursors of indium, aluminium and gallium known by the person skilled in the art and in particular precursors in liquid or solid form can be used in the present invention.

Advantageously, the precursor of A is selected from the salts of A, the halides of A, the oxides of A and the organometallic compounds of A. An "organometallic compound of A", is defined, more particularly, as a tri-substituted compound of A, a carboxylate of A or a phosphonate of A.

A "tri-substituted compound of A", is defined within the meaning of the present invention as a compound of formula $(R_1)_3A$, wherein each $R_1$, identical or different, represents a hydrocarbon group of 1 to 20 carbon atoms such as an alkyl radical, an alkenyl radical, an alkoxy radical, an aryl radical or an aryloxy radical.

A "carboxylate of A", is defined within the meaning of the present invention as a compound of formula $(R_2COO)_3A$, wherein each $R_2$, identical or different, represents a hydrocarbon group of 1 to 20 carbon atoms such as an alkyl radical, an alkenyl radical, an alkoxy radical, an aryl radical or an aryloxy radical.

A "phosphonate of A", is defined within the meaning of the present invention as a compound of formula $[R_3\text{—}P(OR_4)(OR_5)O]_3A$, wherein
- each $R_3$, identical or different, represents a hydrocarbon group of 1 to 20 carbon atoms such as an alkyl radical, an alkenyl radical, an alkoxy radical, an aryl radical or an aryloxy radical;
- each $R_4$, identical or different, represents a hydrogen atom or a hydrocarbon group of 1 to 20 carbon atoms such as an alkyl radical, an alkenyl radical, an alkoxy radical, an aryl radical or an aryloxy radical and
- each $R_5$, identical or different, represents a hydrogen atom or a hydrocarbon group of 1 to 20 carbon atoms such as an alkyl radical, an alkenyl radical, an alkoxy radical, an aryl radical or an aryloxy radical.

Within the meaning of the present invention and unless otherwise stated, an "alkyl group" is defined as a linear, branched or cyclic alkyl group, optionally substituted, of 1 to 20 carbon atoms, notably of 1 to 15 carbon atoms and in particular of 1 to 10 carbon atoms.

Within the meaning of the present invention, an "alkenyl group" is defined as a linear, branched or cyclic alkenyl group, optionally substituted, of 2 to 30 carbon atoms, notably of 2 to 25 carbon atoms and, in particular of 2 to 20 carbon atoms.

Within the meaning of the present invention, an "alkoxy group" is defined as an oxygen atom substituted by an alkyl as defined above.

Within the meaning of the present invention, an "aryl group" is defined as an optionally substituted mono- or polycyclic aromatic group, having 6 to 20 carbon atoms, notably 6 to 14 carbon atoms, in particular 6 to 8 carbon atoms.

Within the meaning of the present invention, an "aryloxy group" is defined as an oxygen atom, substituted by an aryl as defined above.

Within the meaning of the present invention, "optionally substituted" is defined as a radical substituted by one or more groups selected from: an alkyl group, an alkoxy group, a halogen, a hydroxy, a cyano, a trifluoromethyl or a nitro.

Within the meaning of the present invention, a "halogen" is defined as a fluorine, chlorine, bromine or iodine.

Examples of precursors of A, which can be used within the meaning of the present invention, when A is indium, can include indium trichloride, indium triethyl, indium triacetate, indium tri(acetyl-acetonate), indium trioctanoate, indium tristearate, indium trilaurate, indium tripalmitate, indium trimyristate, indium trioleate and mixtures thereof.

Within the meaning of the present invention, the precursor of D optionally used in substep ($a_1$) of the method is selected from the group consisting of the salts of D, the halides of D, the oxides of D and the organometallic compounds of D. An "organometallic compound of D", is defined, more particularly, as a bi-substituted compound of D, a carboxylate of D or a phosphonate of D.

A "bisubstituted compound of D" is defined within the meaning of the present invention as a compound of formula $(R_6)_2D$, wherein each $R_6$, identical or different, represents a hydrocarbon group of 1 to 20 carbon atoms such as an alkyl radical, an alkenyl radical, an alkoxy radical, an aryl radical or an aryloxy radical.

A "carboxylate of D" is defined, within the meaning of the present invention, as a compound of formula $(R_7COO)_2D$, wherein each $R_7$, identical or different, represents a hydrocarbon group of 1 to 20 carbon atoms such as an alkyl radical, an alkenyl radical, an alkoxy radical, an aryl radical or an aryloxy radical.

A "phosphonate of D" is defined, within the meaning of the present invention, as a compound of formula $[R_8\text{—}P(OR_9)(OR_{10})O]_2D$ wherein
- each $R_8$, identical or different, represents a hydrocarbon group of 1 to 20 carbon atoms such as an alkyl radical, an alkenyl radical, an alkoxy radical, an aryl radical or an aryloxy radical;
- each $R_9$, identical or different, represents a hydrogen atom, a hydrocarbon group of 1 to 20 carbon atoms such as an alkyl radical, an alkenyl radical, an alkoxy radical, an aryl radical or an aryloxy radical and
- each $R_{10}$, identical or different, represents a hydrogen atom, a hydrocarbon group of 1 to 20 carbon atoms such as an alkyl radical, an alkenyl radical, an alkoxy radical, an aryl radical or an aryloxy radical.

The alkyl, alkoxy, aryl and aryloxy radicals are as defined for the precursors of A. However, for the precursors of D, an alkenyl radical is a linear, branched or cyclic alkenyl radical, optionally substituted, of 2 to 20 carbon atoms.

The solution comprising at least one precursor of A and optionally at least one precursor of D, i.e. the solution prepared in substep ($a_1$) of the method of the invention, comprises an organic solvent.

Advantageously, said organic solvent is an alkane, a secondary or tertiary amine, or an alkene having a boiling point higher than $T_{a2}$, i.e. higher than the temperature selected for steps ($a_2$) and ($a_3$) of the method according to the invention.

An "alkane" is defined within the meaning of the present invention as an optically substituted linear, branched or cyclic alkane of 1 to 40 carbon atoms, notably of 10 to 35 carbon atoms and, in particular, of 14 to 30 carbon atoms. By way of example, the alkanes likely to be used within the meaning of the present invention are hexadecane and squalane ($C_{30}H_{62}$).

A "secondary or tertiary amine", is defined within the meaning of the present invention as notably dialkylamines and trialkylamines, the alkyl group of which comprises 4 to 24 carbon atoms, notably 8 to 20 carbon atoms. By way of example, the secondary (tertiary) amine likely to be used within the meaning of the present invention is dioctylamine (trioctylamine), which includes 8 carbon atoms per alkyl chain.

An "alkene" is defined within the meaning of the present invention as an optionally substituted linear, branched or cyclical alkene of 2 to 40 carbon atoms, notably of 10 to 35 carbon atoms and, in particular, of 14 to 30 carbon atoms. By way of example, an alkene likely to be used within the meaning of the present invention is 1-octadecene ($C_{18}H_{36}$) or squalene ($C_{30}H_{50}$).

A solvent more particularly used for preparing the precursor solution in substep ($a_1$) of the method according to the invention is 1-octadecene ($C_{18}H_{36}$).

Furthermore, the solution prepared in substep ($a_1$) of the method of the invention can comprise, in addition to organic solvent, an element selected from the group consisting of a stabiliser for the surface of the nanocrystals, a primary amine and one of the mixtures thereof.

Indeed, the solution prepared in substep ($a_1$) may also contain a stabiliser for the surface of the nanocrystals. A "stabiliser for the surface of the nanocrystals", also referred to as a "stabilising ligand", is defined within the meaning of the present invention as an organic molecule which binds to the surface of the nanocrystal and thus prevents the aggregation of nanocrystals. Any stabiliser known by a person skilled in the art can be used within the meaning of the present invention. Advantageously, said stabiliser is selected from thiols and notably aliphatic thiols; alkylphosphines and notably tri(alkyl)phosphines, wherein the alkyl group comprises 4 to 12 carbon atoms; alkylphosphine oxides in which the alkyl group comprises 4 to 12 carbon atoms and phosphonic acids; carboxylic acids and notably aliphatic or olefinic carboxylic acids such as lauric acid, myristic acid, palmitic acid, stearic acid, oleic acid or mixtures thereof.

Within the meaning of the present invention, an aliphatic thiol is of formula $C_nH_{2n+1}$—SH with n representing an integer between 1 and 25, notably between 5 and 20 and, in particular, between 8 and 18. Aliphatic thiols, which can be used within the meaning of the present invention, can include octanethiol (n=8), octadecanethiol (n=18), dodecanethiol (n=12) and mixtures thereof.

A stabiliser more particularly used for preparing the solution of precursors during substep ($a_1$) of the method according to the invention is dodecanethiol (n=12).

Lastly, the solution prepared in substep ($a_1$) may also contain a primary amine. Advantageously, the primary amine is an alkylamine or an alkenylamine in which the alkyl or alkene group comprises 4 to 24 carbon atoms, notably 8 to 20 carbon atoms. By way of example, the primary amines that may be used within the meaning of the present invention are octylamine, dodecylamine, hexadecylamine (HDA) and oleylamine.

A primary amine, more particularly used for preparing the solution of precursors during substep ($a_1$) of the method according to the invention is oleylamine. In a particular embodiment, the solution prepared in substep ($a_1$) of the method according to the invention comprises at least one precursor of A as defined above and optionally one precursor of D as defined above as well as 1-octadecene (organic solvent), dodecanethiol (n=12) (stabiliser) and oleylamine (primary amine).

The concentration of the precursor of A and the precursor of D, if present, in the solution prepared during substep ($a_1$) of the method is between 0.01 and 0.2 mol/L, notably between 0.02 and 0.1 mol/L and in particular between 0.03 and 0.05 mol/L.

Advantageously, the temperature $T_{a1}$ of the solution during the substep ($a_1$) is lower than 50° C., notably lower than 40° C. and, in particular lower than 30° C. More particularly, the solution during substep ($a_1$) is at ambient temperature. "Ambient temperature" is defined as a temperature of 20° C.±5° C.

In an advantageous manner, substep ($a_1$) of the method of the invention is performed under agitation. Different means known to a person skilled in the art may be used for agitating the mixture used in substep ($a_1$) of the method of the invention. By way of example, the mixture may be agitated using a stirrer, a magnetic bar, an ultrasonic bath or a homogeniser.

Lastly, substep ($a_1$) of the method of the invention can be used with a flow of inert gas and in particular with a flow of argon, nitrogen or a mixture thereof.

Substep ($a_2$) of the method of the invention involves aims to bring the mixture prepared in substep ($a_1$) to a temperature $T_{a2}$ higher than the initial temperature of the mixture, i.e. temperature $T_{a1}$ as previously defined.

Advantageously, the temperature $T_{a2}$ of the solution is below 300° C., notably between 100° C. and 300° C., in particular, between 150° C. and 280° C. More particularly, the temperature $T_{a2}$ is in the order of 220° C. A "temperature in the order of 220° C.", is defined as a temperature of 220° C.±20° C.

Thus, once the solution is prepared in substep ($a_1$), the latter is brought from temperature $T_{a1}$ to temperature $T_{a2}$. This may increase either linearly or with at least one intermediate step. In a particularly advantageous manner, this may occur in a linear manner particularly with an increase of 5 to 80° C. per minute, particularly an increase of 20 to 60° C. per minute and, more particularly, an increase of 30 to 50° C. per minute.

Substep ($a_3$) of the method of the invention consists of introducing at least one precursor of B in liquid or solid form, into the solution comprising at least a precursor of A and optionally a precursor of D and keeping the resulting mixture at temperature $T_{a2}$ as previously defined. During this step, the formation and growth of nanocrystals comprising a semiconductor AB and optionally an element D take place.

Within the meaning of the present invention, the precursor of B used is selected from the group consisting of a precursor of antimony, a precursor of arsenic, a precursor of phosphorus, a precursor of nitrogen and mixtures thereof. All of the precursors of antimony, arsenic, phosphorus and nitrogen known by a person skilled in the art and in particular precursors in liquid or solid form can be used in the present invention.

Advantageously, the precursor of B used in the present invention is a compound of formula $B(F(R_{11})_3)_3$, of formula $B(R_{12})_3$ or of formula $B(N(H)R_{13})_3$, wherein:
- each F is selected from the group consisting of silica (Si), germanium (Ge) and tin (Sn);
- each $R_{11}$, identical or different, is a linear, branched or cyclic alkyl group, optionally substituted, of 1 to 10 carbon atoms, notably of 1 to 6 carbon atoms and, in particular, of 1 to 3 carbon atoms;
- each $R_{12}$, identical or different, is a hydrogen atom, a halogen such as chlorine (Cl), bromine (Br), iodine (I) or fluorine (F) or a linear, branched or cyclic alkyl group, optionally substituted, of 1 to 10 carbon atoms, notably of 1 to 6 carbon atoms and, in particular, of 1 to 3 carbon atoms; and
- each $R_{13}$, identical or different, is a hydrogen atom, a linear, branched or cyclic alkyl group, optionally substituted, of 1 to 10 carbon atoms, notably of 1 to 6 carbon atoms and, in particular of 1 to 3 carbon atoms or a linear, branched or cyclic alkenyl group, optionally substituted, of 2 to 30 carbon atoms, notably of 2 to 25 carbon atoms and in particular of 2 to 20 carbon atoms.

In particular, a precursor of B and notably a preferred precursor of phosphorus is of formula $B(N(H)R_{13})_3$, wherein each $R_{13}$, identical or different, is a hydrogen atom or an alkyl or alkenyl group as defined above. More particularly, a precursor of B and notably a preferred precursor of phosphorus is of formula $B(N(H)R_{13})_3$, wherein each $R_{13}$ is an alkenyl group as defined above. A particular example of such a precursor of B, and notably of a precursor of phosphorus, is trioleylamine phosphine of formula $P(N(H)C_{18}H_{35})_3$.

The concentration of the precursor of B in the solution obtained during substep ($a_3$) of the method is between 0.05 and 0.2 mol/L, notably between 0.10 and 0.15 mol/L and in particular between 0.11 and 0.13 mol/L.

In the optional substep ($a_4$) in the method according to the invention, the nanocrystals obtained are purified from the reactional mixture, i.e. the nanocrystals are separated from said reactional mixture. The person skilled in the art knows different techniques for this purification using a step of precipitation, a step of dilution and/or a step of filtration. The techniques used in the prior art for purifying luminescent nanocrystals can be used in the context of substep ($a_4$) of the method of the invention.

Within the meaning of the present invention, the precursor of C used during step (b) of the method is selected from the group consisting of a precursor of silver, a precursor of copper, a precursor of gold, a precursor of mercury and mixtures thereof. All the precursors of silver, copper, gold and mercury known by the person skilled in the art and in particular the precursors in liquid or solid form can be used in the present invention.

Advantageously, the precursor of C is selected from the group consisting of the salts of C, the halides of C, the oxides of C and the organometallic compounds of C. An "organometallic compound of C" is defined more particularly as a substituted compound of C, a carboxylate of C or a phosphonate of C.

A "substituted compound of C" is defined within the meaning of the present invention as a compound of formula $(R_{15})C$, wherein $R_{15}$ represents a hydrocarbon group of 1 to 20 carbon atoms such as an alkyl radical, an alkenyl radical, an alkoxy radical, an aryl radical or an aryloxy radical.

A "carboxylate of C", is defined within the meaning of the present invention as a compound of formula $(R_{16}COO)C$, wherein $R_{16}$ represents a hydrocarbon group of 1 to 20 carbon atoms such as an alkyl radical, an alkenyl radical, an alkoxy radical, an aryl radical or an aryloxy radical.

A "phosphonate of C" is defined within the meaning of the present invention as a compound of formula $[R_{17}—P(OR_{18})(OR_{19})O]C$, wherein
- $R_{17}$ represents a hydrocarbon group of 1 to 20 carbon atoms such as an alkyl radical, an alkenyl radical, an alkoxy radical, an aryl radical or an aryloxy radical;
- $R_{18}$ represents a hydrogen atom, a hydrocarbon group of 1 to 20 carbon atoms such as an alkyl radical, an alkenyl radical, an alkoxy radical, an aryl radical or an aryloxy radical and
- $R_{19}$ represents a hydrogen atom, a hydrocarbon group of 1 to 20 carbon atoms such as an alkyl radical, an alkenyl radical, an alkoxy radical, an aryl radical or an aryloxy radical.

The radicals of alkyl, alkoxy, aryl and aryloxy are as defined for the precursors of A and the alkenyl radical is as defined for the precursors of D.

Advantageously, the precursor of C used is a stearate of C.

Step (b) of the method according to the invention can be performed by contacting a precursor of C with either the solution containing the nanocrystals obtained from substep ($a_3$), or a solution wherein the purified nanocrystals obtained following substep ($a_4$) have been put into suspension. Advantageously, the solution in which the purified nanocrystals have been put into suspension comprises a organic solvent as defined above and optionally a primary amine as defined above.

As a reminder, the temperature $T_b$ and the period $D_b$ during step (b) must be selected such that the nanocrystals are, on average per nanocrystal, doped by a C atom and, notably as a function of the quantity of C precursor and the quantity of nanocrystals. As previously mentioned, it is easy for the person skilled in the art to determine or predetermine the temperature $T_b$ and the period $D_b$ to be used during step (b), in particular by techniques such as mass spectrometry and/or optical emission spectrometry with high-frequency induced plasma or on the basis of the optical and physicochemical property characteristic of the weakly doped nanocrystals which are the subject-matter of the present invention.

The contact is performed at a temperature $T_b$ advantageously lower than temperature $T_{a2}$ used during the preparation of nanocrystals. Typically, the temperature $T_b$ is between 100° C. and 200° C. and in particular in the order of 130° C. (i.e. 130° C.±20° C.). Consequently, when the precursor of C is brought into contact with the solution containing the nanocrystals obtained at the end of substep ($a_3$), the temperature of this solution is close to temperature $T_{a2}$, it is advisable to adjust the temperature of the solution to a temperature lower than or equal to temperature $T_b$ prior to any contact. Alternatively, if the precursor of C is contacted with a solution in which the purified nanocrystals have been put back into suspension, it is suitable to bring this solution to temperature $T_b$ before or after this contact.

The period $D_b$ of contact between the nanocrystals and the precursor of C is typically less than 2 h, notably comprises between 5 min and 50 min.

During step (b), the precursor of C can be used in solid form or in liquid form. In this latter case, it is advantageously in solution in an organic solvent as defined above and optionally in the presence of a primary amine or a carboxylic acid as defined above. The organic solvent of the solution containing the precursor of C may be identical or different to the organic solvent of the solution containing the nanocrystals. In a particular embodiment, the organic solvent of the solution containing the precursor of C and the organic solvent of the solution containing the nanocrystals are identical. This solvent is notably octadecene. If present, the primary amine of the solution containing the precursor of C may be identical or different from the primary amine of the solution containing the nanocrystals. In a particular embodiment, the primary amine of the solution containing the precursor of C and the primary amine of the solution containing the nanocrystals are identical. This primary amine is notably oleylamine. In a more particular embodiment, in the solution containing the precursor of C, the volume of organic solvent is identical to the volume of primary amine.

The concentration of the precursor of C in the solution containing it is between 10 and 100 mmol/L, notably between 15 and 50 mmol/L and in particular between 25 and 35 mmol/L.

Thus, once the contact has been made, the concentration of the precursor of C in the obtained solution is between 0.2 and 2.5 mmol/L, notably between 0.5 and 1.8 mmol/L and in particular between 0.75 and 1.5 mmol/L. An "obtained solution" is defined as the solution corresponding to the mixture between the solution containing the nanocrystals and the solution containing the precursor of C or the solution containing the nanocrystals, in which the precursor of C has been dissolved.

It is possible to purify the weakly doped nanocrystals obtained from step (b) prior to step (c). In this case, everything considered for substep ($a_4$) applies mutatis mutandis to this optional purification step.

Step (c) of the method according to the present invention is a standard step in the field of core/shell nanocrystals. In fact, depending on the chemical nature of the shell to be produced, the person skilled in the art will know how to choose the most suitable precursors as well as the operating conditions for obtaining the growth of such a shell.

Step (c) of the method according to the invention can be performed by contacting the precursor or precursors of the shell with either the solution containing the weakly doped nanocrystals obtained at the end of step (b), or a solution wherein the weakly doped nanocrystals, purified after step (b) are resuspended.

Alternatively, it is possible to introduce the precursor or precursors of the shell into the mixture used for the preparation of the core, i.e. for the preparation of the nanocrystals. In particular, the precursor or precursors of the shell may be present in the solution prepared during step ($a_1$) as defined above. In this alternative, step (c) consists of bringing the mixture obtained at the end of step (b) to a temperature $T_c$ higher than temperature $T_b$. Typically the temperature $T_c$ is lower than 300° C., particularly between 100° C. and 300° C., in particular, between 150° C. and 280° C.

In a particular embodiment, the nanocrystals according to the present invention have a shell the outer part of which comprises a semiconductor of formula $ZnS_{1-x}E_x$, with E representing an element in the −II oxidation state and x being a decimal number such that $0 \leq x < 1$. Among the protocols that can be used for making such a shell, it can be cited those described in international application WO 2010/052221 [5], both in the part relating to the prior art and in the part relating to the actual invention.

The present invention relates to the use of a set of nanocrystals according to the invention or capable of being prepared according to a method of the invention in a light-emitting diode, in a photovoltaic cell, in a luminescent concentrator for a solar cell and for the fluorescent labelling of chemical or biological molecules.

Further features and advantages of the present invention will become apparent to the person skilled in the art from the following examples, given by way of example and without limitation, and with reference to the appended drawings.

DETAILED DESCRIPTION OF PARTICULAR EMBODIMENTS

I. Material and Methods

I.A. Preliminary Remarks

Figure 1:
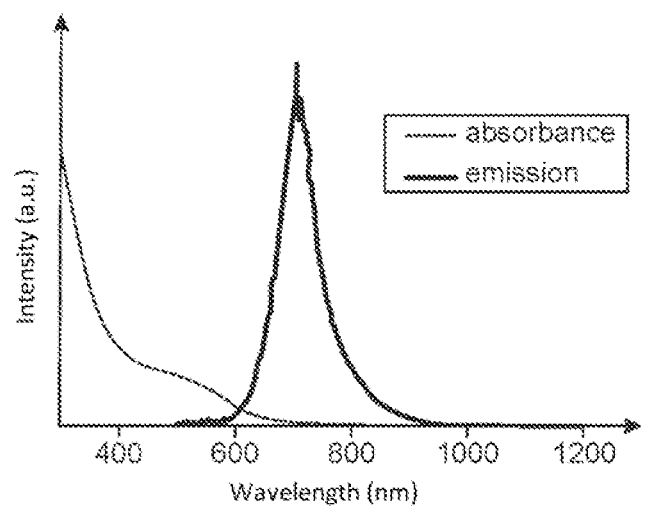
FIG. 1 shows the UV-visible and photoluminescence adsorption spectra of InP nanocrystals with statistically one dopant (Ag) per nanocrystal. Line width at mid-height: 70 nm.

All the syntheses are carried out in an inert atmosphere using argon gas.

For the characterisations, the UV-visible absorption spectra were measured on a HP8420A spectrometer (spectral range in wavelength: 190 nm to 820 nm, resolution 2 nm), the photoluminescence spectra were acquired with a HORIBA Fluorolog iHR320 spectrometer. For these spectroscopic measurements, the colloidal solutions of nanocrystals diluted in hexane were placed in small quartz cells with an optical path of 1 cm. The fluorescence quantum yields at ambient temperature were obtained by comparing the emission intensity—spectrally integrated—of the dispersion of nanocrystals in the hexane with that of a solution of rhodamine 6 G in ethanol, the two solutions having the same optical density (<0.03) at the excitation wavelength (490 nm). The X-ray diffractograms were obtained on a Philips Panalytical device, using a source of copper, at 40 kV and 40 mA. Transmission electron microscopy images were obtained with a FEI Polara microscope.

All products apart from the zinc distearate (Riedel de Haën) were purchased from Sigma-Aldrich and used as such: indium chloride ($InCl_3$, purity 99.999%), zinc distearate (purity 90%), dodecanethiol (purity 98%), 1-octadecene (purity 90%). Tris(dimethylamino)phosphine (PNMe$_2$)$_3$ (97%), oleylamine (OLA, 98%). NaOH, stearic acid and AgNO$_3$.

I.B. Preparation of the Precursor of Phosphorus (Trioleylamine Phosphine, P(OLA)$_3$)

For the preparation of the solution of P(OLA)$_3$, tris(dimethylamino)phosphine (PNMe$_2$)$_3$ (1.3 mL, 7.2 mmol) is added to oleylamine (OLA, 7.1 mL, 21.6 mmol) and heated at 70° C. for 10 h under primary vacuum ($10^{-2}$–$10^{-1}$ mbar) and agitation. The solution obtained has to be stored and used in an inert atmosphere (for example of argon or nitrogen).

I.C. Preparation of Silver Stearate (AgSt):

1 mL of an aqueous solution of NaOH (1 M) is added to 100 mL of an aqueous solution of stearic acid (0.15 M), heated to 80° C. While stirring 17 mL of an aqueous solution of AgNO$_3$ (1 M) is added. The white precipitate which forms is filtered and washed three times with 50 mL distilled water, then dried in an oven at 50° C.

I.D. Synthesis of Ag:In(Zn)P Nanocrystals (Ag500)

Indium chloride (InCl$_3$, 0.3 mmol), zinc distearate (ZnSt$_2$, 0.3 mmol), oleylamine (OLA, 1 mmol), 1-dodecanethiol (1-DDT, 0.3 mmol) and 1-octadecene (ODE, 25 mmol, 8 mL) were mixed in a three-neck flask and purged under vacuum for 30 min.

Then the flask was filled with argon and the reaction solution was heated to 220° C., with a rapid injection of trioleylamine phosphine (P(OLA)$_3$, 1.2 mmol). The reaction solution was cooled at the end of 3 min.

Silver stearate (AgSt, 15 µmol) in a mixture of octadecene and oleylamine (2 mL ODE/OLA mixture (1:1 vol:vol)) was added, dropwise, to the reaction solution containing the In(Zn)P nanocrystals at 130° C., for 30 min.

I.E. Synthesis of Core/Shell Ag:In(Zn)P/ZnS Nanocrystals

After 30 min of doping, the reaction solution was heated again to 220° C. to allow the shell to grow for 1 hour.

I.F. Other Syntheses for Comparison

Figure 3:
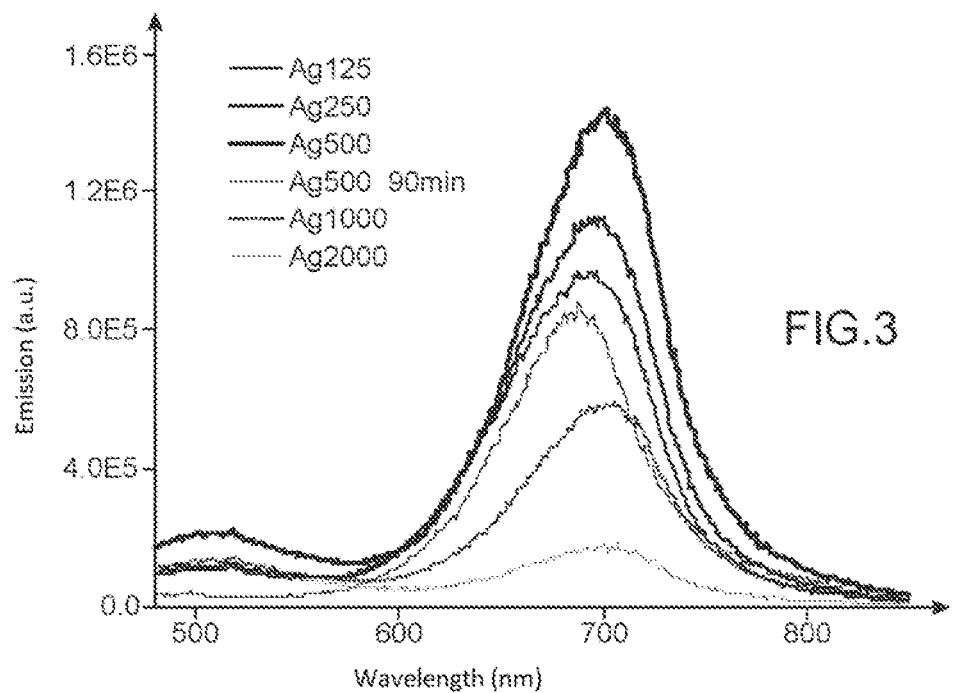
FIG. 3 shows the evolution of photoluminescence spectra (excitation wavelength: 400 nm) as a function of the amount of dopant used (ratio Ag:In:Ag125=0.0125; Ag250=0.025; Ag500=0.05; Ag1000=0.1; Ag2000=0.2).
Figure 4:
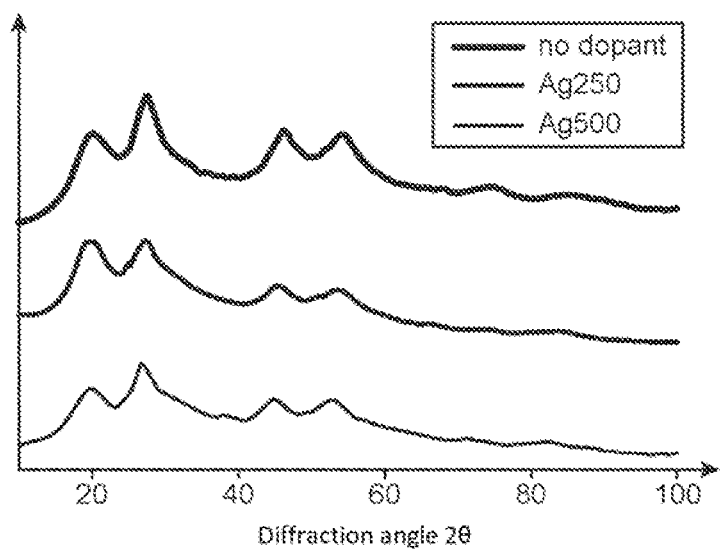
FIG. 4 shows X-ray diffractograms of undoped InP nanocrystals ("no dopant") or prepared with silver in a ratio Ag:In=1:40 i.e. 2.5% ("Ag250") or in a ratio Ag:In=1:20 i.e. 5% ("Ag500").

Synthesis Corresponding to Ag250 in FIGS. 3 and 4:

The procedure is the same as the one described for weakly doped Ag:In(Zn)P nanocrystals (Ag500), but using a quantity of 7.5 µmol silver stearate in a mixture of ODE and OLA (2 mL, 1:1 vol:vol).

Syntheses Corresponding to Ag125/Ag1000/Ag2000 in FIG. 3:

The procedure is same as the one described for the weakly doped Ag:In(Zn)P nanocrystals (Ag500) but using a quantity of 3.75/30/60 µmol silver stearate in a mixture of ODE and OLA (2 mL, 1:1 vol:vol).

II. Results

II.A. Optical Properties

Figure 2:
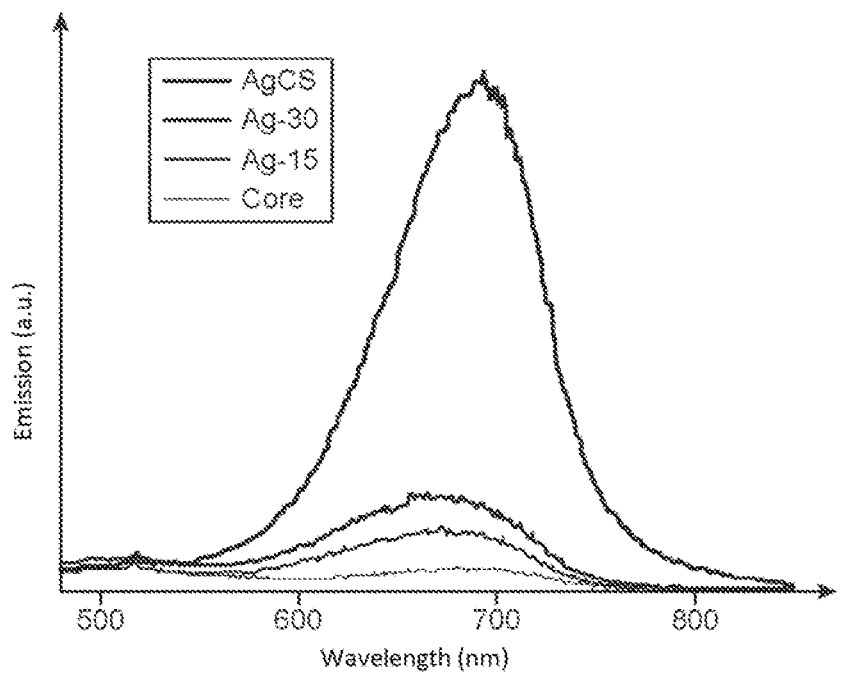
FIG. 2 shows the photoluminescence spectra of undoped InP nanocrystals ("core"), or doped with silver after 15 min of doping ("Ag-15") or after 30 min of doping ("Ag-30"), or doped again with silver after 30 min of doping then covered with a ZnS shell ("AgCS"). Line width at mid-height: 72 nm for AgCS.

The UV-vis absorption and photoluminescence spectra of the samples obtained after the method as described in points I.C and I.D are shown in FIGS. 1 and 2. FIG. 1 shows the absorption and photoluminescence spectra (excitation wavelength: 400 nm) of Ag:In(Zn)P/ZnS core/shell nanocrystals weakly doped with on average one atom of dopant per nanocrystal. The excitonic peak in the region of 550 nm is visible in the UV-vis absorption spectrum, and the photoluminescence spectrum shows a narrow emission line centred at around 700 nm.

FIG. 2 shows the evolution of the photoluminescence spectra (excitation wavelength: 400 nm) before doping ("core") and during the contact period between the dopant and the core nanocrystals (15:15 min, 30:30 min) as well as after the growth of the ZnS shell ("AgCS").

FIG. 3 shows the evolution of the photoluminescence spectra (excitation wavelength: 400 nm) as a function of the quantity of the dopant used (ratio Ag:In:Ag125=0.0125; Ag250=0.025; Ag500=0.05; Ag1000=0.1; Ag2000=0.2). The contact time between the dopant and the In(Zn)P nanocrystals was 30 min for all the samples except for (90 min), referred to as "Ag500 90 min". It can be seen that i) for a used Ag:In ratio of 0.05 (Ag500) the photoluminescence intensity is at a maximum; ii) a prolongation of the contact time from 30 to 90 min leads to a decrease in the photoluminescence intensity.

II.B. Physicochemical Analysis by X-Ray Diffractometry

The X-ray diffractogram of powder for a control sample. i.e. undoped sample and for samples prepared according to the methods described in I.D and I.F are provided in FIG. 4.

For nanocrystals doped statistically with 1 dopant per nanocrystal (Ag250, Ag500), the X-ray diffractogram corresponds to that of the control sample without dopant.

Figure 5:
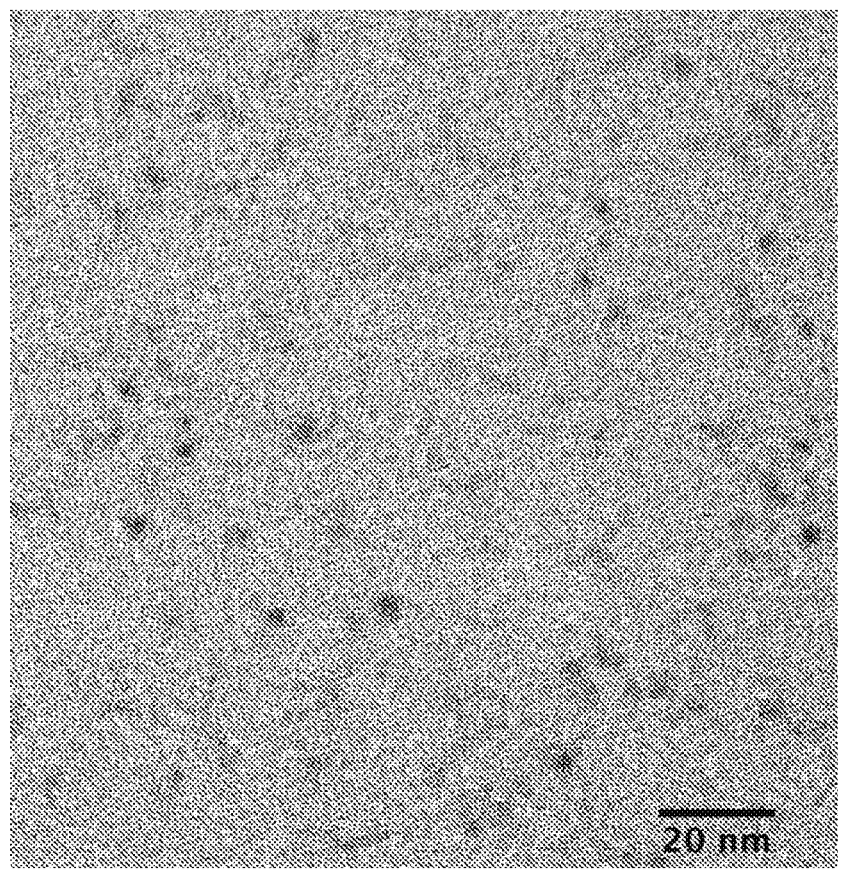
FIG. 5 shows a transmission electron microscopy image of weakly doped core/shell nanocrystals Ag:In(Zn)P/ZnS with an average of one atom of dopant per nanocrystal.

The transmission electron microscopy image shown in FIG. 5 shows weakly doped Ag:In(Zn)P/ZnS core/shell nanocrystals with on average one atom of dopant per nanocrystal. The average size is 4.3±0.4 nm.

REFERENCES

[1] U.S. Pat. No. 9,260,652 published on 16 Feb. 2016.
[2] Thuy et al, 2013, Dalton Trans., vol. 42, page 12606-12610.
[3] U.S. Pat. No. 9,543,385 published on 10 Jan. 2017.
[4] Sahu et al, 2012, Nano Lett., vol. 12, pages 2587-2594.
[5] International application WO 2010/052221, published on 14 May 2010.

What is claimed is:

1. A set of nanocrystals comprising a semiconductor, said semiconductor comprising A and B, wherein A represents a metal or metalloid in the +III oxidation state and B represents an element in the −III oxidation state, said nanocrystals being doped by an atom of C, wherein C is selected from the transition metals in the +I or +II oxidation state, and wherein the nanocrystals are doped on an average of one atom of C per nanocrystal.

2. The set of nanocrystals according to claim 1, wherein A is selected from gallium (Ga), indium (In), aluminium (Al) and mixtures thereof.

3. The of nanocrystals according to claim 1, wherein B is selected from antimony (Sb), arsenic (As), phosphorus (P), nitrogen (N) and mixtures thereof.

4. The of nanocrystals according to claim 1, wherein said nanocrystals further comprise at least one other element D in the form of a metal or metalloid in the +II or +III oxidation state.

5. The of nanocrystals according to claim 1, wherein C is selected from copper (Cu), silver (Ag), mercury (Hg), gold (Au) and mixtures thereof.

6. The of nanocrystals according to claim 1, wherein said nanocrystals correspond to any of the following formulae: Ag:InP, Au:InP, Cu:InP, Ag:In(Zn)P, Au:In(Zn)P and Cu:In(Zn)P.

7. The of nanocrystals according to claim 1, wherein said nanocrystals have a shell arranged on or covering all or part of their surface.

8. The of nanocrystals according to claim 1, wherein said nanocrystals have a core comprising a semiconductor material selected from the group consisting of Ag:InP, Au:InP, Cu:InP, Ag:In(Zn)P, Au:In(Zn)P and Cu:In(Zn)P and a shell comprising a semiconductor material of formula $ZnS_{1-x}E_x$, wherein E represents an element in the −II oxidation state and x is a decimal number such that $0 \leq x \leq 1$.

9. A method for the preparation of a set of nanocrystals as defined in claim 1, said method comprising steps of:
   a) preparing nanocrystals comprising a semiconductor, said semiconductor comprising A and B and optionally D, wherein D is a metal or metalloid in the +II or +III oxidation state;
   b) contacting the nanocrystals prepared in step (a) with a precursor of C at a temperature $T_b$ and for a period $D_b$ to obtain doped nanocrystals; and
   c) optionally coating all or part of the surface of the doped nanocrystals with a shell, wherein the outer part of the shell comprises an oxide or a semiconductor material.

10. The method according to claim 9, wherein said step (a) comprises substeps of:
   $a_1$) preparing a solution comprising at least a precursor of A and optionally a precursor of D at a temperature $T_{a1}$;
   $a_2$) bringing the mixture obtained in substep ($a_1$) from temperature $T_{a1}$ to temperature $T_{a2}$, wherein $T_{a2}$ is higher than $T_{a1}$;
   $a_3$) introducing, into the mixture obtained in substep ($a_2$) and maintained at temperature $T_{a2}$, at least a precursor of B; and
   $a_4$) optionally purifying the nanocrystals.

11. The method according to claim 10, wherein said precursor of A is selected from salts of A, halides of A, oxides of A and organometallic compounds of A.

12. The method according to claim 10, wherein said precursor of D is selected from the group consisting of salts of D, the halides of D, oxides of D and organometallic compounds of D.

13. The method according to claim 10, wherein said solution prepared in said substep ($a_1$) comprises a solvent and an element selected from the group consisting of a stabiliser for the surface of the nanocrystals, a primary amine and a mixture thereof.

14. The method according to claim 10, wherein said temperature $T_{a2}$ is lower than 300° C.

15. The method according to claim 10, wherein said precursor of B is selected from the group consisting of formulas $B(F(R_{11})_3)_3$, of formula $B(R_{22})_3$ or $B(N(H)R_{13})_3$, wherein:
   each F is selected from the group consisting of silica (Si), germanium (Ge) and tin (Sn);
   each $R_{11}$, identical or different, is a linear, branched or cyclic alkyl group, optionally substituted, of 1 to 10 carbon atoms;
   each $R_{12}$, identical or different, is selected from a hydrogen atom, a halogen, or a linear, branched or cyclic alkyl group, optionally substituted, of 1 to 10 carbon atoms; and
   each $R_{13}$, identical or different, is selected from a hydrogen atom, a linear, branched or cyclic alkyl group, optionally substituted, of 1 to 10 carbon atoms, or a linear, branched or cyclic alkenyl group, optionally substituted, of 2 to 30 carbon atoms.

16. The method according to claim 10, wherein said precursor of C is selected from the group consisting of salts of C, the halides of C, oxides of C and organometallic compounds of C.

17. The method according to claim 9, wherein said temperature $T_b$ is between 100° C. and 200° C.

18. A light-emitting diode, a photovoltaic cell, a luminescent concentrator for a solar cell or a fluorescent labelled chemical or biological molecule comprising the set or nanocrystals according to claim 1.

19. The set of nanocrystals according to claim 8, wherein said nanocrystals have a core consisting of a semiconductor material corresponding to any of the following formulae: Ag:InP, Au:InP, Cu:InP, Ag:In(Zn)P, Au:In(Zn)P and Cu:In(Zn)P and a shell comprising a semiconductor material of formula $ZnS_{1-x}E_x$, wherein E represents an element in the −II oxidation state and x is a decimal number such that $0 \leq x < 1$.

20. The set of nanocrystals according to claim 8, wherein said nanocrystals have a core comprising a semiconductor material selected from the group consisting of Ag:InP, Au:InP, Cu:InP, Ag:In(Zn)P, Au:In(Zn)P and Cu:In(Zn)P and a shell consisting of a semiconductor material of formula $ZnS_{1-x}E_x$, with E and x with wherein E represents an element in the −II oxidation state and x is a decimal number such that $0 \leq x < 1$.

21. The method according to claim 14, wherein said temperature $T_{a2}$ is between 150° C. and 280° C.

22. The method of claim 15, wherein each $R_{11}$, identical or different, is a linear, branched or cyclic alkyl group, optionally substituted, of 1 to 3 carbon atoms; or wherein each $R_{12}$, identical or different, is a linear, branched or cyclic alkyl group, optionally substituted, of 1 to 3 carbon atoms; or wherein each $R_{13}$, identical or different, is selected from a hydrogen atom, a linear, branched or cyclic alkyl group, optionally substituted, of 1 to 3 carbon atoms, or a linear, branched or cyclic alkenyl group, optionally substituted, of 2 to 20 carbon atoms.

23. The set of nanocrystals according to claim 8, wherein said nanocrystals have a core consisting of a semiconductor material corresponding to any of the following formulae: Ag:InP, Au:InP, Cu:InP, Ag:In(Zn)P, Au:In(Zn)P and Cu:In(Zn)P and a shell consisting of a semiconductor material of formula $ZnS_{1-x}E_x$, wherein E represents an element in the −II oxidation state and x is a decimal number such that $0 \leq x < 1$.

* * * * *